United States Patent [19]

Muller et al.

[11] 3,967,307

[45] June 29, 1976

[54] LATERAL BIPOLAR TRANSISTOR FOR INTEGRATED CIRCUITS AND METHOD FOR FORMING THE SAME

[75] Inventors: Richard S. Muller, Kensington; Lewis K. Russell, San Jose, both of Calif.

[73] Assignee: Signetics Corporation, Sunnyvale, Calif.

[22] Filed: July 10, 1975

[21] Appl. No.: 594,700

Related U.S. Application Data

[63] Continuation of Ser. No. 383,810, July 30, 1973, abandoned.

[52] U.S. Cl............................. 357/35; 357/15; 357/34; 357/23
[51] Int. Cl.²............ H01L 29/72; H01L 29/48; H01L 29/56; H01L 29/64
[58] Field of Search.............. 357/15, 34, 35, 22, 357/23

[56] References Cited
UNITED STATES PATENTS

| | | | |
|---|---|---|---|
| 3,280,391 | 10/1966 | Bittmann | 357/15 |
| 3,479,233 | 11/1969 | Lloyd | 357/35 |
| 3,519,898 | 7/1970 | Nakatani | 357/36 |
| 3,704,399 | 11/1972 | Glaise | 357/35 |
| 3,742,592 | 7/1973 | Rizzi et al. | 357/34 |
| 3,913,123 | 10/1975 | Masaki et al. | 357/34 |

*Primary Examiner*—Andrew J. James
*Attorney, Agent, or Firm*—Flehr, Hohbach, Test Albritton & Herbert

[57] ABSTRACT

An integrated circuit and method for forming the same including a lateral bipolar transistor having an increased current gain. Floating islands are formed in the emitter of the lateral transistor to have a conductivity type opposite that of the emitter and which act to channel current towards the periphery of the emitter, thereby directing the current towards the collector region. In addition, the integrated circuit includes a buried layer underlying the lateral transistor with the buried layer pinched very thin along a region which outlines the edge of the emitter for enhancing lateral current flow.

4 Claims, 9 Drawing Figures

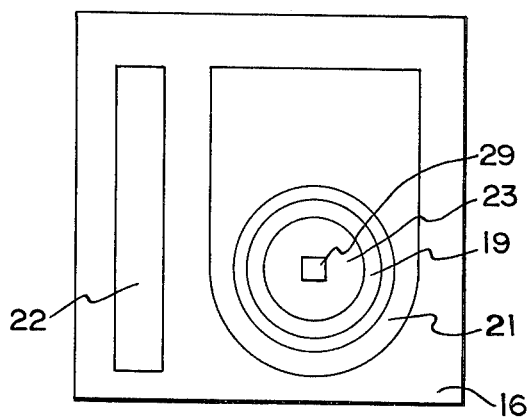
FIG. 6
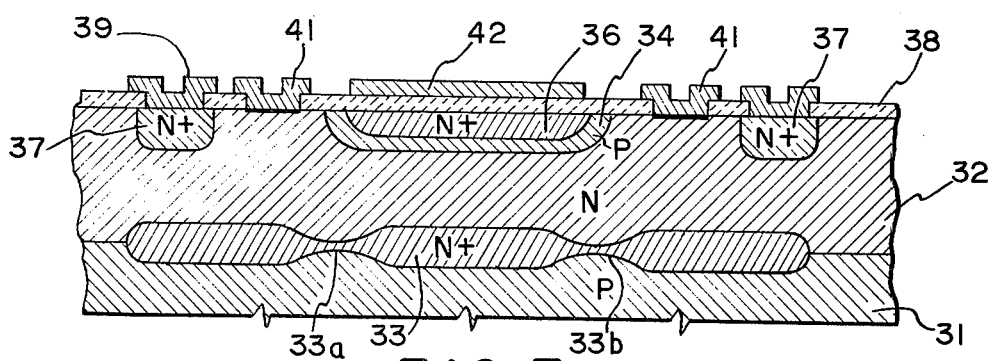
FIG. 7
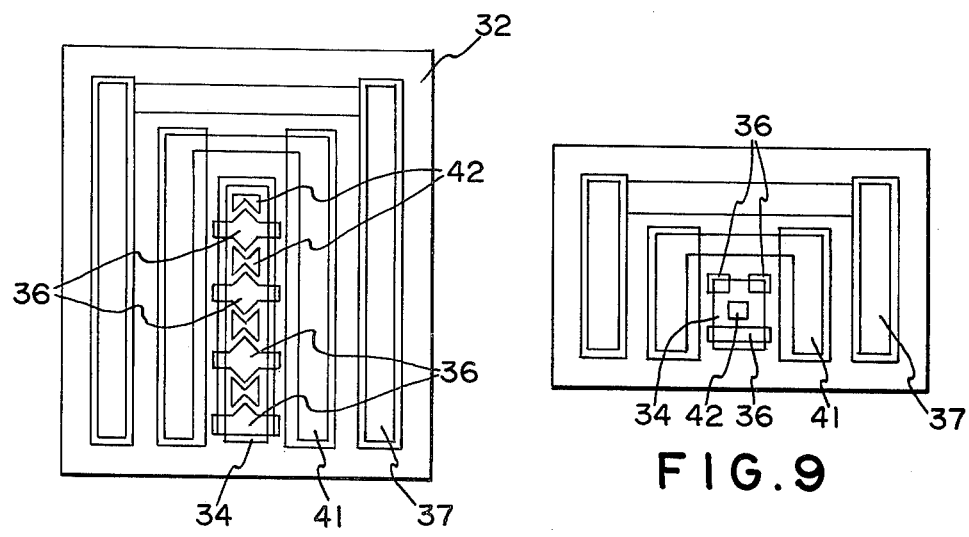
FIG. 8
FIG. 9

LATERAL BIPOLAR TRANSISTOR FOR INTEGRATED CIRCUITS AND METHOD FOR FORMING THE SAME

This is a continuation, of application Ser. No. 383,810 filed July 30, 1973 and now abandoned.

BACKGROUND OF THE INVENTION

This invention pertains to an integrated circuit and method for forming the same which includes a lateral bipolar transistor having an increased current gain.

Lateral bipolar transistors are used quite often in integrated circuits but have the substantial disadvantage of being low current gain devices. For example, typical PNP lateral transistors utilized in integrated circuits have current gains on the order of 2 or 3 at best. It would be advantageous to be able to fabricate integrated circuits having lateral bipolar transistors in which the current gain is substantially higher than 2 or 3.

OBJECTS AND SUMMARY OF THE INVENTION

Accordingly, it is an object of this invention to provide an integrated circuit and method for forming the same including a lateral bipolar transistor having an increased current gain.

Briefly, in accordance with one embodiment of the invention there is provided an integrated circuit including a lateral bipolar transistor and including a semiconductor substrate of a first conductivity type with an epitaxial semiconductor layer of a second conductivity type formed thereon. A buried layer of the first conductivity type is formed between the epitaxial layer and substrate. An emitter region is provided in the epitaxial layer of the first conductivity type and extends to the surface of the epitaxial layer overlying the buried layer. A collector region is also formed in the epitaxial layer adjacent to and spaced from the emitter region. The buried layer is necked down to a smaller width adjacent the periphery of the emitter region and underlying the space in the epitaxial layer between the emitter region and the collector region for enhancing lateral current flow between the emitter and collector regions.

BRIEF DESCRIPTION OF THE DRAWINGS

FIG. 6 is a top plan view of the transistor structure formed in the series of FIGS. 1 through 5.

FIG. 7 is a cross-sectional view similar to FIG. 5 but illustrating formation of a Schottky-collector transistor formed in accordance with the invention.

FIGS. 8 and 9 are top plan views of two different embodiments of Schottky-collector transistors formed in accordance with the invention.

DESCRIPTION OF THE PREFERRED EMBODIMENTS

Figure 1:
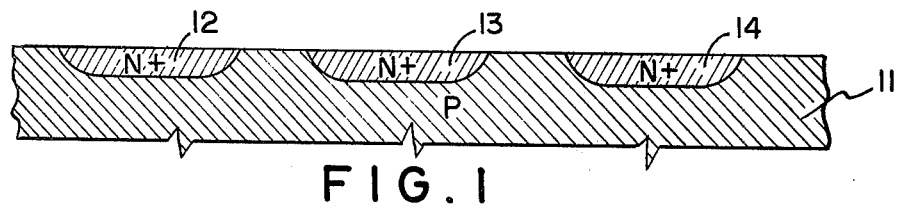
FIGS. 1 through 5 are cross-sectional views of a portion of an integrated circuit in accordance with the invention and illustrating steps in the formation of a lateral bipolar transistor having an increased current gain.
Figure 2:
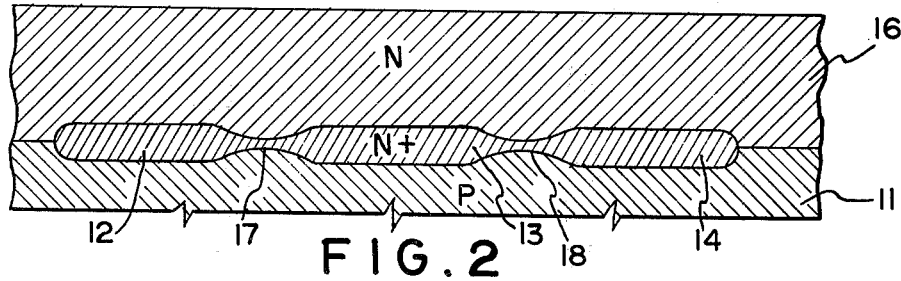
Figure 3:
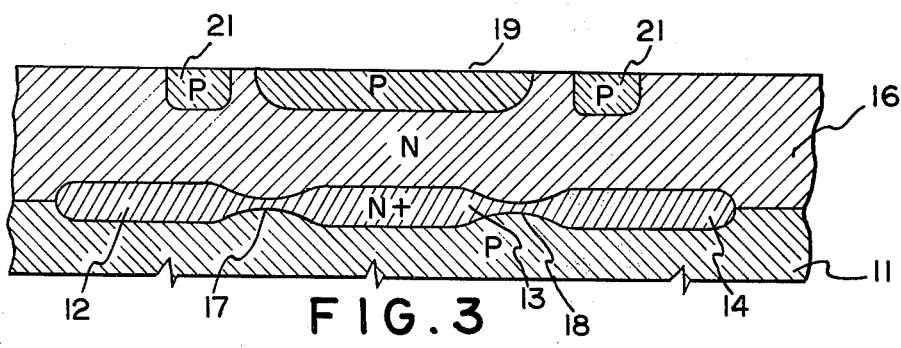

Turning now to the series of the FIGS. 1 through 5 there are shown cross-sections of an integrated circuit including a lateral bipolar transistor having an increased current gain in accordance with the invention. Various of the steps and formations of the transistor in accordance with the invention are illustrated in the FIGS. 1 through 5 although no attempt has been made to illustrate the various photolithographic masking processes for example, which are well known to those skilled in the art. Thus in FIG. 1 there is provided a semiconductor substrate 11 which may, for example, be of a P-type conductivity. Three regions of an opposite conductivity type which may be N-type conductivity for example, are formed in the semiconductor substrate 11. These regions are illustrated in FIG. 1 by regions 12, 13 and 14. These three N+ type regions 12, 13 and 14 are spaced with respect to each other along the substrate 11. The distance by which these N+ regions should be spaced with respect to one another is approximately the lateral thermionic diffusion distance for the buried layer dopant. Subsequently, and as indicated in FIG. 2, an epitaxial layer 16 is grown on top of the substrate 11. As this epitaxial layer 16 is grown as known to those skilled in the art the N+ dopant diffuses upwardly and outwardly resulting in a structure such as shown in FIG. 2. Thus the thermionic diffusion of the N+ doping joins together the regions 12, 13 and 14 through necked down or pinched areas 17 and 18. There results a continuous N+ buried layer having portions thereof necked down or pinched. Thereafter, the usual diffusions, for example, are made to form the various regions of the lateral transistor. As illustrated in FIG. 3 a P-type region 19 is formed which serves as an emitter for the transistor and a collector ring 21 is formed adjacent to but spaced from the emitter region 19 and comprises a P-type region formed in the epitaxial layer 16.

Figure 4:
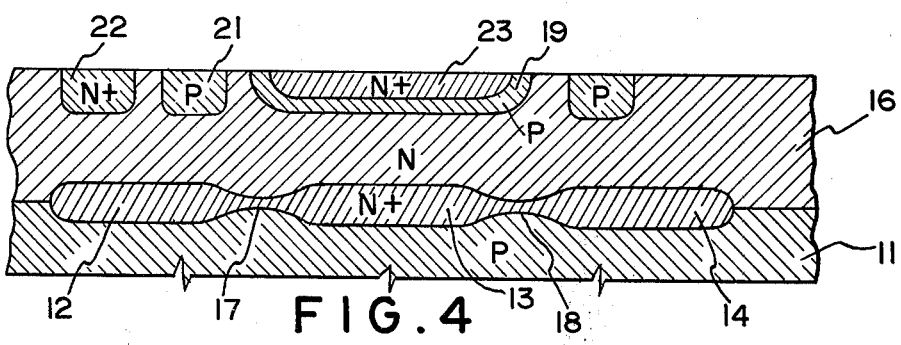

Thereafter, a base contact diffusion 22 of N+ type region as shown in FIG. 4 is formed. In accordance with the invention, at the same time the N+ base contact region 22 is formed islands of N+ type conductivity 23 are formed in the emitter region 19, as illustrated in FIG. 4.

Figure 5:
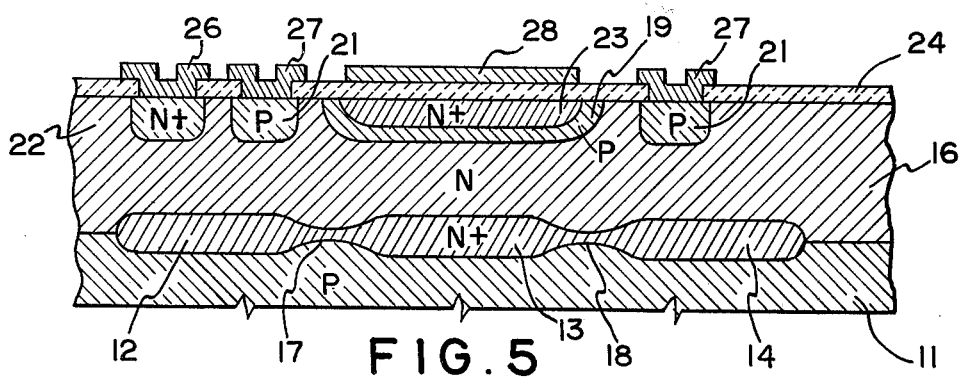

Thereafter, the usual operations are performed for completing construction of the lateral transistor, resulting in the structure shown in FIG. 5. The epitaxial region 16 thus has a layer of insulating material such as silicon dioxide 24 formed on the top thereof with windows opened in the silicon dioxide and metallization deposited thereon for making contact to the various regions in the semiconductor. Thus, there is shown metallization 26 making contact with the N+ type base contact region 22 and metallization 27 making contact with the P-type collector ring 21. Metallization 28 is deposited on top of the silicon dioxide layer 24 and selected portions of the metallization 28 extend down through the silicon dioxide layer 24 to make contact with the P-type emitter region 19 as will hereinafter be more particularly described.

In the construction shown in FIG. 5 the purpose of both the pinched areas 17 and 18 of the N+ buried layer and the N+ type region 23 formed in the emitter region 19 is to enhance lateral current flow from the emitter to the collector region while retarding current flow in a vertical sense. The effect of the pinched or necked portions of the buried layer 17 and 18 is to alter the equipotential lines within the epitaxial layer 16 so as to enhance current flow in a lateral direction from the P-type emitter region 19 to the collector ring 21. The N+ type region 23 formed in the emitter region 19 has the same effect of enhancing the lateral current flow from the emitter region 19 to the collector ring 21 by in effect forcing the current out the sides. The region 23 of the N+ type material formed in the emitter region 19 is not connected to anything, but rather floats at potentials which back bias it from the adjoining P-type zones or regions.

Referring to FIG. 6 there is shown a top plan view of the structure of FIG. 5 but with the silicon dioxide layer 24 and the various metallization omitted for the sake of clarity. Thus the epitaxial layer 16 has an N+ type region 22 forming a base contact means. The region 21 comprises the collector ring of P-type material and the circular region 19 comprises the emitter of P-type material. The region 23 which comprises an N+ area formed in the emitter region 19 is also shown in FIG. 6. An opening or window 29 is formed in the N+ type region 23. This opening or window 29 permits metallization which is later applied over the silicon dioxide layer covering the structure of FIG. 6 to extend downwardly through the N+ type region 23 for making contact to the emitter region 19.

Turning now to consideration of FIG. 7 there is shown a cross section of an integrated circuit incorporating another embodiment of the invention. In FIG. 7 as before there is provided a substrate 31 which may, for example, be of P-type conductivity on top of which there is formed an epitaxial layer 32. A buried layer 33 of N+ type material is formed between the substrate 31 and epitaxial layer 32 and includes necked down or pinched portions 33a and 33b. A P-type emitter region 34 is formed in the epitaxial layer 32 and islands of N+ type materials 36 are formed extending down into the P-type region 34 as will be more fully hereinafter explained. An N+ type region 37 is formed comprising a base contact region. A layer of insulating material 38 such as silicon dioxide is formed on the top of the epitaxial layer 32 and various openings are made in the layer for forming metallization for contacting the emitter and the base contact means as well as openings for forming a Schottky collector. Thus metallization 39 is provided for contacting the N+ type base contact region 37. Metallization 41 is provided extending down to and making rectifying contact with the epitaxial layer 32 for forming a Schottky-collector for the PNP lateral transistor being formed in a manner well known to those skilled in the art. Metallization 42 is provided for contacting the P-type emitter region 34 in a manner which will be more fully described hereinafter.

Referring now to FIG. 8 there is shown a top plan view of an embodiment of a lateral PNP Schottky-collector type transistor formed in accordance with the invention. Thus in FIG. 8 the epitaxial layer 32 has a base contact region 37 formed therein along with the Schottky collector 41. The emitter region 34 has a plurality of N+ type islands 36 extending down into the P-type emitter region 34. A plurality of butterfly-shaped windows 42 form part of the emitter metallization for permitting the emitter metallization to make contact to the P-type region 34.

The structure of FIGS. 7 and 8 operates in essentially the same manner as the previously described embodiment. The N+ type islands 36 enhance lateral hole injection between the emitter region 34 and the collector 41. The necked down or pinched portions 33a and 33b of the buried layer 33 also act to enhance lateral current injection from the emitter as described before.

FIG. 9 is a top plan view of another embodiment of the invention for which FIG. 7 could also be a cross-section. Thus, in the embodiment in FIG. 9 the base contact region 37 is provided along with the Schottky collector region 41. An emitter 34 has a plurality of N+ type islands 36 formed thereon and therein as before explained. A window 42 forms part of the metallization 42 for contacting the P-type emitter region 34.

Thus what has been described is an integrated circuit and method for forming the same including a lateral bipolar transistor having an increased current gain. The increased current gain is due to forming necked down or pinched portions of a buried layer for enhancing lateral current injection between the emitter and collector of the transistor. Also, floating islands of a conductivity type opposite that of the emitter region are formed in the emitter region and also increase lateral current flow by enhancing injection of holes from the emitter to the collector. These islands of a conductivity type opposite that of the emitter float so that they are back-biased from the emitter region for the above mentioned purpose. Utilizing both the floating islands and the pinched buried layer structure PNP lateral transistors have been fabricated which have been observed to have greatly increased current gain, greater than 10 or 11 for example.

Throughout the preceding discussion the invention has been discussed with reference to a PNP lateral bipolar transistor. The invention is equally applicable, however, to lateral transistors of the NPN conductivity type. For such a construction all the conductivity types in the figures in the foregoing discussion should be simply reversed. Increased current gain also results from such NPN lateral transistor structures. Thus, although the invention has been described with reference to specific illustrated embodiments, it should be obvious to those skilled in the art that various modifications can be made to the specific embodiments disclosed herein without departing from the true spirit and scope of the invention.

We claim:

1. In an integrated circuit a lateral bipolar transistor having increased current gain comprising a semiconductor substrate of a first conductivity type having an epitaxial semiconductor layer of a second conductivity type formed thereon, a buried layer of said second conductivity type formed between said epitaxial layer and substrate, an emitter region of said first conductivity type formed in said epitaxial layer overlying the buried layer and extending to the surface of said epitaxial layer with a PN emitter base junction being defined between the emitter region and the epitaxial layer, means for enhancing lateral current from said emitter region to said collector region and for retarding current flow in a vertical sense perpendicular to the lateral direction said enhancing means including at least one island of second conductivity type formed in said emitter region and further including a collector region formed in said epitaxial layer spaced from and adjacent to said emitter region.

2. An integrated circuit in accordance with claim 1 wherein said collector region comprises a region of said first conductivity type formed in said epitaxial layer surrounding and spaced from said emitter region.

3. An integrated circuit in accordance with claim 1 wherein said collector region comprises metallization contacting said epitaxial layer to form a Schottky barrier-type collector surrounding and spaced from said emitter region.

4. An integrated circuit in accordance with claim 1 including a buried layer of said second conductivity type formed between said epitaxial layer and substrate and being necked down to a smaller width generally below the portions of said PN emitter base junction extending to the surface of said epitaxial layer.

\* \* \* \* \*